United States Patent [19]

Srivastava

[11] 4,399,549

[45] Aug. 16, 1983

[54] ODD NUMBER FREQUENCY DIVISION WITH SYMMETRICAL OUTPUT

[75] Inventor: Gopal K. Srivastava, Buffalo Grove, Ill.

[73] Assignee: Zenith Radio Corporation, Glenview, Ill.

[21] Appl. No.: 293,918

[22] Filed: Aug. 18, 1981

[51] Int. Cl.³ .................. H03K 21/36; H03K 23/24
[52] U.S. Cl. ............................. 377/108; 377/116; 377/119
[58] Field of Search ............... 377/108, 115, 116, 109, 377/118, 119

[56] References Cited

U.S. PATENT DOCUMENTS

| | | | |
|---|---|---|---|
| 3,873,815 | 3/1975 | Summers | 377/108 |
| 3,902,125 | 8/1975 | Oliva, Jr. | 377/108 |
| 3,906,374 | 9/1975 | Fletcher et al. | 377/108 |
| 3,943,379 | 3/1976 | McGuffin | 377/119 |
| 3,967,205 | 6/1976 | Rossi et al. | 377/108 |

FOREIGN PATENT DOCUMENTS 57-26930  2/1982  Japan ............................ 377/119

OTHER PUBLICATIONS

Article entitled "Divide Symmetrical Clock Pulses by Odd Numbers, Get a Symmetrical Output", p. 110 of the Mar. 1, 1980 Edition of *Electronic Design*.

*Primary Examiner*—John S. Heyman
*Assistant Examiner*—Timothy P. Callahan

[57] ABSTRACT

A method and apparatus is described for dividing a clock frequency by any odd number to obtain a symmetrical output. Generally, some dividers in a chain of divide-by-two dividers are designated as controlled dividers and others are designated as uncontrolled dividers. The clock input of each controlled divider receives the output of an exclusive NOR gate, the inputs to which include the output of the last divider in the chain and either the clock signal or the output of a preceding divider, depending on certain criteria. The clock input of each uncontrolled divider receives the output of an immediately preceding divider. With this arrangement, the last divider in the chain develops a divided output which is symmetrical.

5 Claims, 6 Drawing Figures

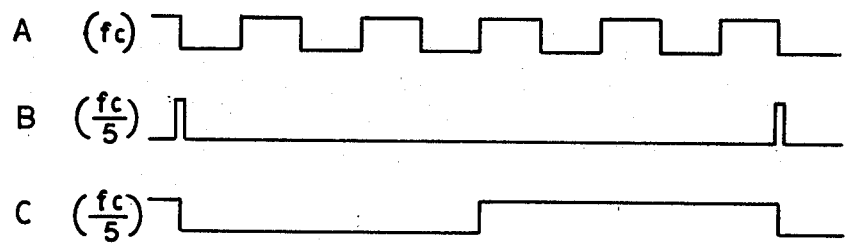
FIG. 1
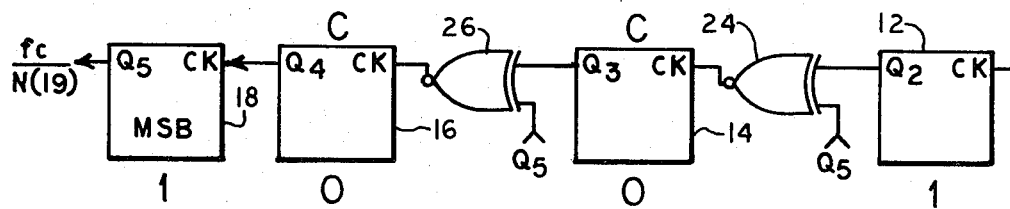
FIG. 2
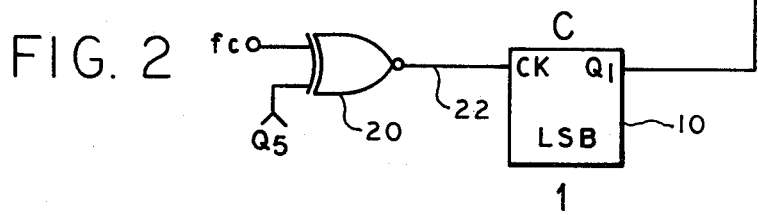
EX NOR
EX OR
| TRUTH TABLE | | |
|---|---|---|
| A | B | C |
| 0 | 0 | 1 |
| 0 | 1 | 0 |
| 1 | 0 | 0 |
| 1 | 1 | 1 |
FIG. 3
| TRUTH TABLE | | |
|---|---|---|
| A | B | C |
| 0 | 0 | 0 |
| 0 | 1 | 1 |
| 1 | 0 | 1 |
| 1 | 1 | 0 |
FIG. 6

ODD NUMBER FREQUENCY DIVISION WITH SYMMETRICAL OUTPUT

BACKGROUND OF THE INVENTION

This invention is directed to improvements in digital frequency dividers. It is particularly directed to such dividers which are adapted to divide a clock frequency by an odd number.

Many applications require that the frequency of a symmetrical clock signal (fc) be divided by an odd number N to obtain an output fc/N. Although this type of division is relatively easy to accomplish, it is somewhat harder to ensure that the output fc/N is symmetrical. For example, waveform A of FIG. 1 shows a clock signal fc whose frequency is to be divided by five. Most conventional digital dividers produce the unsymmetrical output shown as waveform B of FIG. 1.

To develop a divided output which is symmetrical (waveform C of FIG. 1), it has been proposed to multiply the clock signal fc by two, then divide the multiplied clock signal by five (or any odd number), and then divide the last quotient by two. Although this technique produces a symmetrical output, the circuitry required is relatively complex, and, therefore, expensive.

OBJECTS OF THE INVENTION

It is a general object of the invention to provide an improved method and apparatus for dividing a clock frequency by an odd number.

It is a more specific object of the invention to provide such a method and apparatus which is relatively simple and which can divide a clock frequency by virtually any odd number.

BRIEF DESCRIPTION OF THE FIGURES

The objects stated above and other objects of the invention are set forth more particularly in the following detailed description of the accompanying drawings, in which:

FIG. 1, previously described, shows a clock signal fc, an unsymmetrical divided-by-five output signal and a symmetrical divided-by-five output;

FIG. 2 shows an exemplary divider according to the invention for dividing a clock signal by nineteen;

FIG. 3 depicts a type of exclusive NOR gate which may be used with a negative edge triggered divider of the type shown in FIG. 2, and a truth table showing the logic levels associated with the exclusive NOR gate;

FIG. 6 depicts a type of exclusive OR gate which may be used with a positive edge triggered divider and a truth table showing the logic levels associated with the exclusive OR gate.

DESCRIPTION OF THE PREFERRED EMBODIMENT

Figure 4:
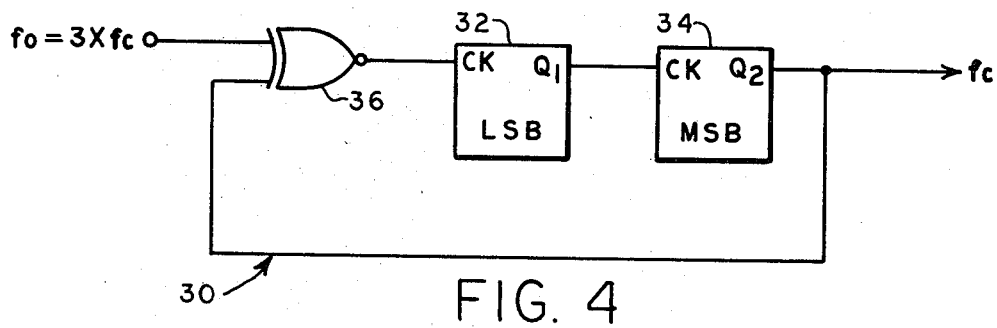
FIG. 4 shows another exemplary divider according to the invention for dividing a clock frequency by three.

As an example of how the invention provides a symmetrical output using a chain of dividers, reference is made to FIG. 2. In this and the other figures, a clock signal whose frequency is to be divided by an odd number is designated fc. The output of the divider chain is designated as fc/N, where N is the odd number by which the clock signal is to be divided.

For illustrative purposes, the divider chain in FIG. 2 is designed to divide the clock signal by nineteen. To select the correct number of individual dividers in the chain, the log (N+1) is divided by log 2 and the integer which is next larger than the resultant quotient is used as the number of dividers. In this example, log (19+1) divided by log 2 equals 4.32. Hence, five dividers are chosen. In the case where the quotient equals an integer, that integer is selected as the number of dividers. Thus, where N equals 3, (log 3+1) divided by log 2 equals 2, wherefore two dividers are selected.

In the illustrated embodiment, the five dividers are designated by the numerals 10, 12, 14, 16 and 18. Each divider has a clock input (CK) and an output (Q).

To select the appropriate input for each of the dividers, associate with each divider a binary digit (binary one or binary zero, for example) so that the combination of the digits represents the number N in binary form. Thus, the binary digits 1 0 0 1 1 correspond to the decimal number nineteen. The leftmost binary digit 1 is the most significant digit or bit, and this digit is associated with the last divider in the chain, divider 18. The rightmost binary digit is the least significant digit or bit and this digit is associated with the first divider in the chain, divider 10. The middle binary digits 0 0 1 are associated with the dividers 16, 14 and 12, respectively. To indicate this association, FIG. 2 includes a binary digit below each divider with which it is associated. In addition, the divider 10 is indicated as LSB (least significant bit) and the divider 18 is indicated as MSB (most significant bit).

In the discussion below, some of the dividers are referred to as "controlled" dividers and others are referred to as "uncontrolled" dividers. As used herein, the "controlled" dividers include the divider associated with the least significant digit (divider 10) and the dividers associated with each binary zero (dividers 14 and 16).

Included in the definition of "uncontrolled" dividers is the divider associated with the most significant digit (divider 18) and the other dividers associated with a binary 1 (divider 12). In FIG. 2, each of the controlled dividers is identified by a "C" above it. The definitions of controlled and uncontrolled dividers apply to a divider chain of any length. In the following example, given below, the counters are negative edge triggered. If, however, the counter were positive edge triggered the controlled dividers would then require exclusive OR instead of exclusive NOR.

The next step in the design of the divider chain includes exclusive NORing the output of the divider associated with the most significant digit (divider 18) with the clock signal fc to provide a first control signal. In the illustrated example, this step is performed by including an exclusive NOR logic gate 20 which receives the clock signal fc and the output ($Q_5$) of the divider 18 for developing the first control signal at its output. That control signal is applied to the clock input of the divider associated with the least significant digit. In this embodiment, the clock input of the divider 10 receives the output of the gate 20 via a lead 22.

For every other controlled divider, the output of the divider associated with the most significant digit is exclusive NOR'd with the output of an immediately preceding divider in the chain, and the resultant control signal is applied to the clock input of the controlled divider. Because the divider 14 is a controlled divider, its clock input is derived, in accordance with the criteria above, from an exclusive NOR gate 24 whose inputs include the output of the divider 12 and the output ($Q_5$) of the divider 18. Likewise, the clock input of the controlled divider 16 receives the output of an exclusive NOR gate 26. The inputs to this gate are the outputs $Q_3$ and $Q_5$ from dividers 14 and 18.

The clock input of each uncontrolled divider is derived from the output of an immediately preceding divider. Thus, the clock input of the uncontrolled divider 12 is taken from the output $Q_1$ of the divider 10. Likewise, the clock input of the divider 18 is received from the output $Q_4$ of the divider 16.

With the arrangement shown in FIG. 2, the output $Q_5$ of the divider 18 has a frequency which is nineteen times lower than the frequency of the clock signal fc. Moreover, the output $Q_5$ is symmetrical as exemplified by waveform C of FIG. 1.

In the discussion above, exclusive NORing is shown as being implemented by logic gates 20, 24 and 26. However, other combinations of logic circuitry may be used to implement the function of an exclusive NOR gate. In general, therefore, exclusive NORing is meant to include the logical operation performed by a conventional exclusive NOR gate 28 (FIG. 3) or any other circuitry which operates according to the truth table shown in the same figure.

When the dividers shown in FIG. 2 are positive edge triggered, the logic gates 20, 24 and 26 may be replaced by an exclusive OR gate such as the gate 29 shown in FIG. 6 which operates according to the truth table shown in the same figure. Because an exclusive OR gate is the logical compliment of an exclusive NOR gate, and because it is immaterial whether the dividers are positive edge triggered or negative edge triggered, the term "exclusive NOR" as used herein is meant to include its logical compliment when the dividers are positive edge triggered.

Referring now to FIG. 4, a divider chain 30 is shown which is designed to divide a color television receiver's color oscillator signal fo by three to get a color subcarrier signal fc. This chain is particularly useful in a receiver whose color oscillator frequency has been selected three times the color subcarrier frequency for use in driving a CCD (charge coupled device). To use the same oscillator for color circuits, the oscillator frequency must be divided by three.

As with the previous example, a binary digit is associated with each of a pair of dividers 32 and 34 such that the combination of the binary digits corresponds to the decimal number N. Since N equals 3 in this case, a binary digit 1 is associated with each of the dividers 32 and 34. The divider 32 corresponds to the least significant bit and the divider 34 corresponds to the most significant bit. Hence, the divider 32 is the only controlled divider in this chain.

The clock input to the divider chain 30 is received by an exclusive NOR gate 36 whose inputs are the oscillator signal fo and the output $Q_2$ from the divider 34. The clock input to the divider 34 is received from the output $Q_1$ of the divider 32. With this arrangement, the $Q_2$ output of the divider 34 is symmetrical and has a frequency which is the frequency of the color subcarrier.

Figure 5:
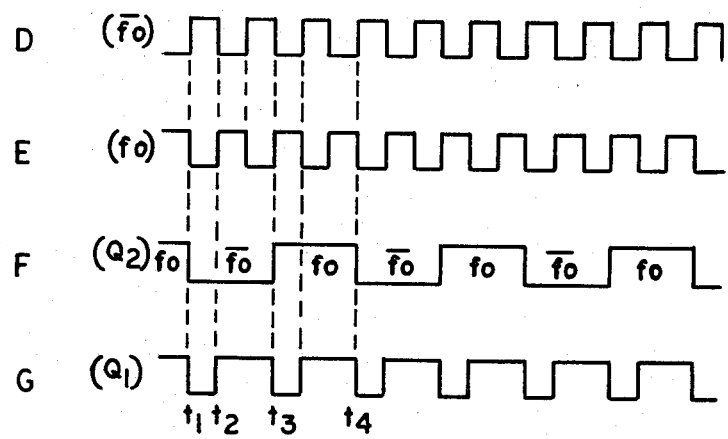
FIG. 5 illustrates various waveforms useful in explaining the operation of the divider shown in FIG. 4.

The manner in which a divider chain according to the invention provides a symmetrical output is best explained with reference to FIG. 4 and the waveforms shown in FIG. 5. Waveform D of the latter Figure represents $\overline{fo}$, waveform E represents the clock signal fo, waveform F represents the output $Q_2$ of the divider 34, and waveform G represents the output $Q_1$ of the divider 32. As shown by the notations fo and $\overline{fo}$ in waveform F, the exclusive NOR gate 36 causes the divider 32 to be clocked by the trailing edges of fo and $\overline{fo}$ during alternate intervals. For example, at time $t_1$ $Q_2$ is high; therefore, the first illustrated negative going edge of fo clocks the divider 32 and causes its output $Q_1$ to go low. This causes divider 34 to go low. The clock input to divider 32 now corresponds to $\overline{fo}$.

At time $t_2$, $\overline{fo}$ goes low and clocks divider 32 so that its output $Q_1$ goes high. This will not affect divider 34. At time $t_3$, $\overline{fo}$ goes low again and the output $Q_1$ is driven low, causing the divider 34 to go high. Now the clock input to divider 32 corresponds to fo. This operation continues with $Q_1$ being driven high and low as shown by waveform G.

Because the divider 34 is clocked on each negative going edge of $Q_1$, $Q_2$ goes low at time $t_1$, goes high at time $t_3$, goes low again at time $t_4$, etc. Consequently, a symmetrical output is obtained.

Each of the dividers shown in FIGS. 2 and 4 is preferably a conventional flip-flop which is negative edge triggered. Positive edge triggered flip-flops may also be used, in which case the logic gates will be exclusive OR. Note that the dividers do not include a reset input because reset is obtained automatically.

In the foregoing description, the individual dividers may be, when considered alone, divide-by-two dividers. However, when such dividers are connected in circuit as shown in the various Figures, the circuit configuration controls the operation of the individual dividers so that they no longer necessarily divide by two.

Although the invention has been described in terms of illustrative examples, it will be obvious to those skilled in the art that many alterations and variations may be included without departing from the invention. Accordingly, all such alterations and modifications are intended to be considered as within the spirit and scope of the invention as defined by the appended claims.

What is claimed is:

1. In a chain of dividers, each having a clock input and an output, a method of dividing a clock signal by an odd number N to obtain a symmetrical, divider output, comprising:

associating with each divider a binary digit one or zero so that the combination of the digits represents the number N in binary form;

selecting as controlled dividers the divider associated with the least significant digit and dividers associated with each binary zero digit;

selecting as uncontrolled dividers the divider associated with the most significant digit and the remaining dividers associated with each binary one digit;

exclusive NORing the output of the divider associated with the most significant digit with the clock signal to provide a first control signal;

applying the first control signal to the clock input of the divider associated with the least significant digit;

for every other controlled divider, exclusive NORing the output of the divider associated with the most significant digit with the output of an immediately preceding divider in the chain, and applying the resultant control signal to the clock input of the controlled divider; and coupling to the clock input of each uncontrolled divider to the output of an immediately preceding divider, whereby the divider associated with the most significant digit develops a symmetrical output whose frequency is N times lower than the frequency of the clock signal.

2. A method as set forth in claim 1 wherein each divider is a divide-by-two divider.

3. A chain of dividers for dividing a clock signal by an odd number N, comprising:

a plurality of dividers, each of which is associated with a binary digit one or zero so that the combination of the digits represents the number N in binary form;

a logic circuit for exclusive NORing the clock signal with the output of the divider associated with the most significant digit;

means for coupling the output of said logic circuit to the clock input of the divider associated with the least significant digit;

logic circuit means for applying to the clock input of each divider associated with a binary digit zero the exclusive NOR of the output of an immediately preceding divider and the output of the divider associated with the most significant digit; and means for coupling, to the clock input of each remaining divider associated with a binary digit one, the output of an immediately preceding divider, whereby the divider associated with the most significant digit develops a symmetrical output whose frequency is N times lower than the frequency of the clock signal.

4. A chain of dividers as set forth in claim 3 wherein each of the dividers is a divide-by-two divider.

5. A chain of dividers as set forth in claim 4 wherein each of the dividers comprises a flip-flop.

* * * * *